US011182237B1

United States Patent
Singidi et al.

(10) Patent No.: US 11,182,237 B1
(45) Date of Patent: Nov. 23, 2021

(54) SELECTIVE SAMPLING OF A DATA UNIT BASED ON PROGRAM/ERASE EXECUTION TIME

(71) Applicant: Micron Technology, Inc., Boise, ID (US)

(72) Inventors: Harish R Singidi, Fremont, CA (US); Ashutosh Malshe, Fremont, CA (US); Vamsi Pavan Rayaprolu, San Jose, CA (US); Kishore Kumar Muchherla, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/000,062

(22) Filed: Aug. 21, 2020

(51) Int. Cl.
*G06F 11/00* (2006.01)
*G06F 11/07* (2006.01)
*G11C 29/00* (2006.01)

(52) U.S. Cl.
CPC .......... *G06F 11/079* (2013.01); *G06F 11/073* (2013.01); *G06F 11/0757* (2013.01); *G06F 11/0793* (2013.01); *G11C 29/883* (2013.01)

(58) Field of Classification Search
CPC .. G06F 11/079; G06F 11/073; G06F 11/0757; G06F 11/0793; G06F 11/0754
See application file for complete search history.

(56) References Cited

U.S. PATENT DOCUMENTS

| 2008/0103542 | A1* | 5/2008 | Hoyme | G06F 11/073 607/27 |
| 2015/0169403 | A1* | 6/2015 | Yen | G11C 16/3495 714/760 |
| 2019/0012228 | A1* | 1/2019 | Hsiao | G06F 11/076 |
| 2019/0205198 | A1* | 7/2019 | Wang | G06F 11/0793 |

\* cited by examiner

*Primary Examiner* — Katherine Lin
(74) *Attorney, Agent, or Firm* — Lowenstein Sandler LLP (57) ABSTRACT

A processing device, operatively coupled with the memory device, is configured to perform an operation on a page of a plurality of pages of a data unit of the memory device to modify data on the page. The processing device also determines a first operation execution time of the page upon performing the operation on the page of the data unit. The processing device further determines whether the first operation execution time satisfies a condition that is based on a predetermined second operation execution time, the predetermined second operation execution time is indicative of lack of defect in at least one other data unit. Lastly, responsive to determining that the first operation execution time satisfies the condition, the processing device performs a scan operation of at least a subset of the plurality of pages of the data unit to decide whether the data unit has a defect.

20 Claims, 7 Drawing Sheets

```
                    ┌─────────────────────────────────────────────────────────────┐
                    │ PERFORM AN OPERATION ON A PAGE OF A PLURALITY OF PAGES OF A │
                    │        DATA UNIT OF A MEMORY DEVICE TO MODIFY DATA          │
                    │                      ON THE PAGE;                           │
                    │                           310                               │
                    └─────────────────────────────────────────────────────────────┘
                                               │
                                               ▼
                    ┌─────────────────────────────────────────────────────────────┐
                    │   DETERMINE A FIRST OPERATION EXECUTION TIME OF THE PAGE    │
                    │              UPON PERFORMING THE OPERATION                  │
                    │                           320                               │
                    └─────────────────────────────────────────────────────────────┘
                                               │
                                               ▼
                    ┌─────────────────────────────────────────────────────────────┐
                    │ DETERMINE WHETHER THE FIRST OPERATION EXECUTION TIME        │
                    │ SATISFIES A CONDITION THAT IS BASED ON A PREDETERMINED      │
                    │ SECOND OPERATION EXECUTION TIME, WHEREIN THE PREDETERMINED  │
                    │ SECOND OPERATION EXECUTION TIME IS INDICATIVE OF LACK OF    │
                    │            DEFECT IN AT LEAST ONE OTHER DATA UNIT           │
                    │                           330                               │
                    └─────────────────────────────────────────────────────────────┘
                                               │
                                               ▼
                    ┌─────────────────────────────────────────────────────────────┐
                    │ RESPONSIVE TO DETERMINING THAT THE FIRST OPERATION EXECUTION│
                    │ TIME SATISFIES THE CONDITION THAT IS BASED ON THE           │
                    │ PREDETERMINED SECOND OPERATION EXECUTION TIME, PERFORM A    │
                    │ SCAN OPERATION OF AT LEAST A SUBSET OF THE PLURALITY OF     │
                    │ PAGES OF THE DATA UNIT TO DECIDE WHETHER THE DATA UNIT      │
                    │                      HAS A DEFECT.                          │
                    │                           340                               │
                    └─────────────────────────────────────────────────────────────┘
```

SELECTIVE SAMPLING OF A DATA UNIT BASED ON PROGRAM/ERASE EXECUTION TIME

TECHNICAL FIELD

The present disclosure generally relates to memory sub-systems, and more specifically, relates to selective sampling of a data unit based on program/erase execution time.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to supporting selective sampling of a data unit based on program/erase execution time in memory devices of a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory devices that store data. The host system can provide data to be stored at the memory sub-system and can request data to be retrieved from the memory sub-system. The memory devices can include volatile and non-volatile memory devices that can store data from the host system. One example of non-volatile memory devices is a negative-and (NAND) memory device. Other examples of non-volatile memory devices are described below in conjunction with FIG. 1. Each of the non-volatile memory devices can include one or more arrays of memory cells. A memory cell ("cell") is an electronic circuit that stores information. Depending on the cell type, a cell can store one or more bits of binary information, and has various logic states that correlate to the number of bits being stored. The logic states can be represented by binary values, such as "0" and "1", or combinations of such values.

Various memory access operations can be performed on the memory cells. Data can be written to, read from, and erased from memory cells. Memory cells can be grouped into a write unit, such as a page (also hereinafter referred to as a "memory page"). For some types of memory devices, a page is the smallest write unit. A page size represents a particular number of cells of a page. A page is a set of cells across the same word line. Each page can contain a number of codewords, which are the smallest addressable (readable) unit in the memory device.

For some types of memory devices (e.g., NAND), memory cells can be grouped into an erase unit, such as a physical block, which is a group of pages. A physical block is a 2-dimensional memory array of pages (rows of cells) and strings (columns of cells). Data can be written to a block, page-by-page. Data can be erased at a block level. However, portions of a block cannot be erased. Multiple blocks can be grouped to form a plane. One or multiple planes can be grouped together to form a physical die of the memory device. A memory device can include one or more dice. A single die or multiple die stacked on top of each other can be grouped to form a package. A data unit can be the entire memory sub-system, a die of memory component, a collection of codewords, a collection of memory pages, a collection of memory blocks, or any other meaningful portion of the memory sub-system.

As data gets written to a memory cell of the memory device for storage, the memory cell, with time, can deteriorate and can eventually become defective. For example, when too many read and write operations are performed on a memory cell, data stored at the memory cell and adjacent memory cells of the memory component can become corrupted or incorrectly stored at the memory cell. Additionally, many memory sub-systems support a redundancy mechanism to protect the host data against a failure of a portion of a memory device that is storing the host data. For example, for a negative-and (NAND) type flash memory device, the memory sub-system can implement a redundant array of independent NAND (RAIN) operation to provide redundancy for the data stored on the memory sub-system. As an example, the memory sub-system can generate parity data when writing data received from the host system to the memory sub-system to be able to reconstruct or recalculate the host data in the event of a failure of the portion of the memory device that is storing data from the host system. This parity data is temporarily stored at a certain location of the memory sub-system, such that it can be released when the corresponding pages of memory are determined to be free from reliability issues or likelihood of defects. Therefore, in order to be able to release parity data and to detect a potential occurrence of a defect before a data loss is caused by the defect, the memory sub-system performs operations to detect the likelihood of the occurrence of a defect at data units of the memory devices by frequently scanning the data units of the memory sub-system.

Many defects of the data units can result in a higher error rate when reading the data stored at the data units, thus the read error rate can be used as an indicator of the health of the data unit and can be determined during the execution of a data integrity check (also referred to herein as a "scan") to verify that the data stored at each data unit does not include errors. Therefore, a scanning mechanism that can ensure there is adequate sampling of memory cells across all data units can be preferred. However, the scanning operation for data integrity checks is costly and can introduce latency due to the read operations, repeated error detection, and correction operations that take place during a scan operation. As an example, for a given data unit, if every page is scanned and then possibly exposed to a correction operation (error control operation), this process can result in a reduction of the overall performance of a memory sub-system. Furthermore, as more resources of the memory sub-system are used to perform the error control operations, fewer resources are available to perform other read operations or write operations of host data. Therefore, scanning operation coverage (which pages to scan) and frequency (how often to run a scan) can be tuned to minimize latency and performance penalties.

Common scanning practices include performing a scan operation of all pages of a data unit upon performing a program erase cycle (PEC) operation on the data unit. Based on the scan results of every page of the data unit, error detection and correction mechanisms can be applied to the data unit and parity data can further be released for the pages that are determined to be healthy. While this approach provides ultimate coverage for error detection, the scanning process in this case is largely time and bandwidth consuming, as it requires every page of the memory device to be scanned within a few PEC operations, thereby negatively affecting performance and increasing latency.

Aspects of the present disclosure address the above and other deficiencies by providing selective sampling of data units in a memory device based on program/erase times of the data units. In implementations, a decision of whether or not to scan a data unit can be determined based on program time and/or erase time of the data unit. For example, program time of performing a write operation to store data at a page of the data unit can be measured in order to determine whether or not the data unit should be scanned for defects. Many defects of data units can cause an increased program time and erase time of the data unit even before causing data loss of data stored at the data unit. Therefore, tracking program times and erase times of data units can provide indications of potential defects of the data units, so that actions can be taken to mitigate the potential data loss of host data.

After identifying the program time of the page, the program time can be compared with a reference program time that is determined to be indicative of healthy data units. If the program time associated with the data unit exceeds the reference program time by a predetermined margin, it can be determined that the data unit is likely to have a defect, and thus a scan operation of the data unit can be initiated. On the other hand, if the program time of the pages of the data unit does not exceed the reference program, the data unit can be excluded from scanning during the current program/erase cycle. In other implementations, the determination of whether or not to scan a data unit can be decided based on an erase time of the data unit instead of the program time of the data unit, as explained in more details herein below.

In implementations, when the data unit is scanned, the scan operation can be performed on a subset of pages of the data unit in order to determine whether or not the data unit can be retired. As an example, if the data unit is being scanned because the program time of a page of the data unit exceeded the reference program time, the subset of pages to be scanned can be the set of pages adjacent to the page and within a blast radius from the page to determine if any of the pages has a defect. If a defect is detected, the data unit can be retired. Retiring the data unit refers to moving the data stored at the data unit to another data unit of the memory sub-system, thus any impact of the defect is minimized because host data is not stored at the data unit.

In other implementations, the scan operation can be performed on a subset of pages of the data unit in order to determine whether or not to release parity data associated with the scanned pages of the data unit. In implementations, when a set of pages of the memory device is deemed not defective (e.g., by scanning the set of pages and determining that an error rate of the pages is within acceptable limits), the memory sub-system can release the parity data associated with the set of pages. In order to release parity data of the scanned pages of the data unit, the set of pages of the data unit that have been programmed can be scanned. If the scan results indicate that the scanned pages are not defective, the data stored at the scanned pages can be determined to be valid and thus the pages are unlikely to need recovery using the parity data. The parity data associated with the scanned pages can thus be released.

In yet other implementations, when an increased program time of a page of the data unit is detected, the page can be assigned to a list of scan candidate pages of the data unit and the scan operation of the data unit can be deferred until all pages of the data unit have been programmed. When all pages of the data unit have been programmed, the list of scan candidate pages of the data unit can be inspected and if any page is assigned to the list of scan candidates, a scan operation of the data unit can be initiated. Conversely, if no pages are assigned to the list of scan candidates, the data unit can be excluded from being scanned during the current program/erase cycle.

The techniques of supporting selective scanning of pages of a data unit in a memory sub-system based on program/erase times that are described herein enable an improved overall performance of the memory sub-system. Performing health checks in memory devices, e.g., by scanning the data units of the memory devices, introduces performance penalty as the bandwidth of the memory sub-system is at least partially consumed in executing the scan operations. Therefore, by scanning only a subset of the pages in each data unit, the time consumed in performing the scan operations can be reduced significantly. Additionally, because data units can be excluded from scanning if the program times of the data units and/or the erase times of the data units are within acceptable limits, the frequency of performing scan operations on a given data unit can also be reduced considerably. Therefore, the techniques described herein of supporting selective sample of data units based on program time and erase time of the data units reduce the overhead of scanning every data unit and every page of the data unit at each program/erase operation, which improves the overall performance of the memory sub-system.

Figure 1:
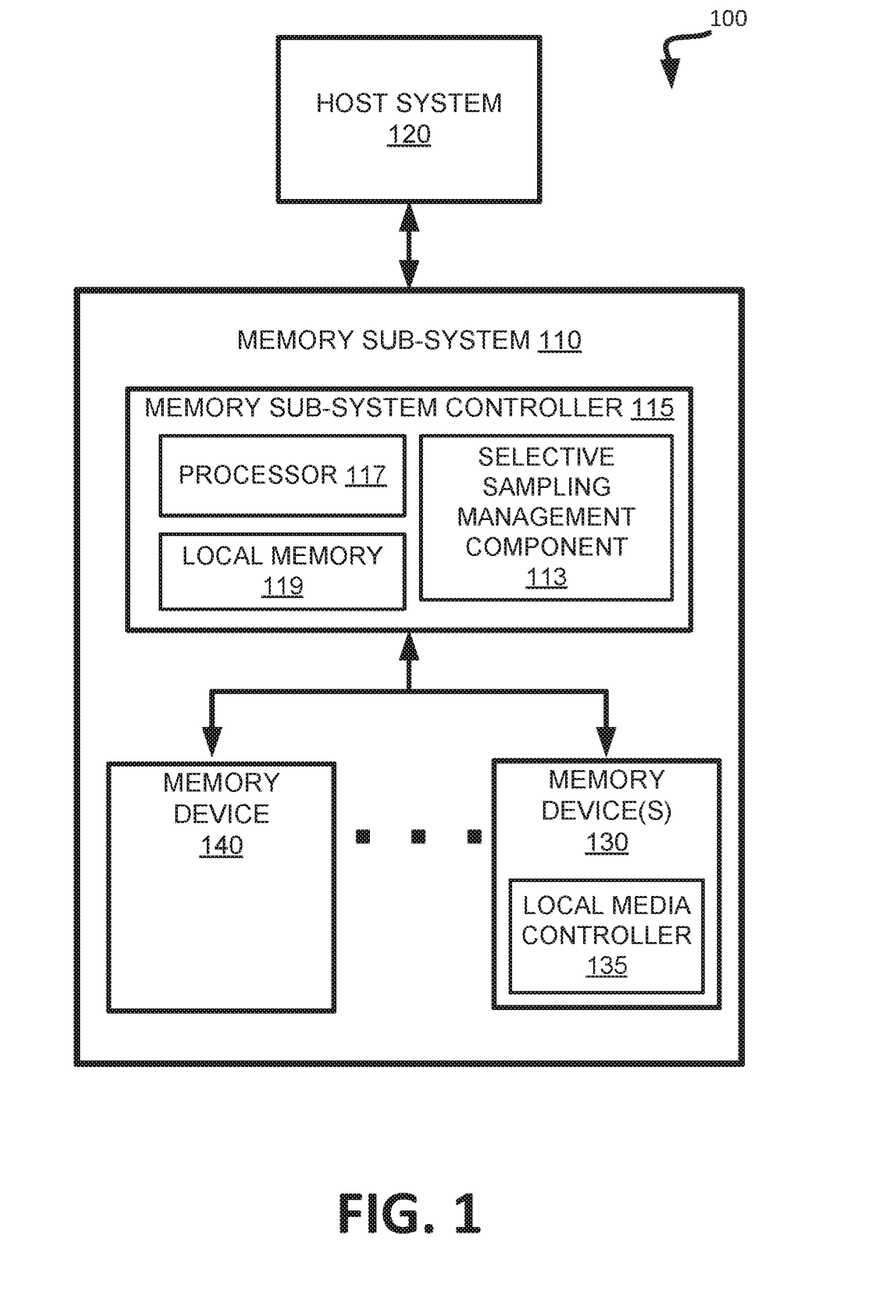
FIG. 1 illustrates an example computing system for supporting selective sampling of a data unit based on program/erase times, in accordance with some embodiments of the present disclosure.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A 3D cross-point memory device is a cross-point array of non-volatile memory cells that can perform bit storage based on a change of bulk resistance, in conjunction with a stackable cross-gridded data access array. Additionally, in contrast to many flash-based memories, cross-point non-volatile memory can perform a write-in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric random access memory (FeRAM), ferroelectric transitor random-access memory (FeTRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and may instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

In some embodiments, the memory sub-system 110 includes a selective sampling management component 113 that can be used to support selective sampling of data units in a memory device based on program/erase execution times of the data units. In implementations, selective sampling management component 113 can selectively scan a data unit based on program time and/or erase time of the data unit. Selective sampling management component 113 can track program time of performing a write operation to store data at the data unit, erase time of performing an erase operation of data stored at the data unit, or both, in order to determine whether or not the data unit should be scanned for defects. In certain implementations, selective sampling management component 113 can determine the time it takes to program onto pages of the data unit. Selective sampling management component 113 can then compare the program time with a reference program time that is determined to be indicative of healthy data units (data units identified as not having defects). As an example, the reference program time can be determined based on historical data that is collected over a period of time for programming data on a set of healthy data units. In an illustrative example, selective sampling management component 113 can identify a set of data units as healthy (i.e., do not have defects) based on results of a scan operation. Selective sampling management component 113 can then measure a program time for each data unit of the set of data units and can use the measured program times as reference or baseline (for example, after determining the mean and the standard deviation of the measured program times for the set of data units). Selective sampling management component 113 can store the reference program time at a predetermined location within memory sub-system 110. In implementations, selective sampling management component 113 can update the reference program time periodically to reflect changes that may occur to program time as the memory sub-system ages.

If the program time associated with the data unit is longer than the reference program time by a predetermined margin (e.g., program time of the data unit is longer than the reference program time by at least 100 microseconds), selective sampling management component 113 can determine that the data unit is likely to have a defect, and can initiate a scan operation of the data unit. Conversely, if selective sampling management component 113 determines that the program time of the pages of the data unit does not exceed the reference program time by the predetermined margin, selective sampling management component 113 can exclude the data unit from scanning during the current program/erase cycle.

In other implementations, selective sampling management component 113 can determine the time it takes to erase data stored at the data unit (e.g., upon receiving an erase operation). Selective sampling management component 113 can then compare the erase time of the data unit with a reference erase time that is determined to be indicative of healthy data units. If the erase time associated with the data unit exceeds the reference erase time by a predetermined margin (e.g., using statistical outlier detection methodologies to determine standard deviations and determining that erase time of the data unit is longer than the reference erase time by 3 or more standard deviations), selective sampling management component 113 can determine that the data unit is likely to have a defect, and can flag the data unit as a scan candidate. In this case, selective sampling management component 113 can initiate a scan operation when data has been programmed on the data unit, for example. On the other hand, if selective sampling management component 113 determines that the erase time of the data unit does not exceed the reference erase time by the predetermined margin, selective sampling management component 113 can exclude the data unit from scanning during the current program/erase cycle.

In implementations, when selective sampling management component 113 initiates a scan operation of the data unit, the scan operation can be performed on a subset of pages of the data unit in order to determine whether or not the data unit can be retired. As an example, if the data unit is being scanned because the program time of a page of the data unit exceeded the reference program time, the subset of pages to be scanned can be the set of pages adjacent to the page and within a blast radius from the page, as explained in more details in FIG. 2A-B. Selective sampling management component 113 can scan the set of pages within the blast radius to determine if any of the pages has a defect.

When the set of pages of the data unit are scanned (i.e., by performing read operations on the set of pages), selective sampling management component 113 can determine a reliability metric based on the read operations and can retire the data unit if the reliability metric (e.g., average RBER) does not meet a predetermined threshold. Retiring the data unit refers to moving the data stored at the data unit to another data unit of memory sub-system 110, and marking the data unit such that it can no longer be used for storing host data. Because the data unit is retired, when the defect causing the increased program/erase time is detected, e.g., by causing loss of data stored at the data unit, any impact of the defect is minimized because host data is not stored at the data unit.

In other implementations, when selective sampling management component 113 initiates a scan operation of the data unit, the scan operation can be performed on a subset of pages of the data unit in order to determine whether or not to release parity data associated with the scanned pages of the data unit. In implementations, when a set of pages of the memory device are deemed not defective (e.g., by scanning the set of pages and determining that RBER of the pages is within acceptable limits), the memory sub-system can release the parity data associated with the set of pages, thus freeing space in the parity data storage location for new parity data of other data units. Parity data can be calculated stored temporarily to recover host data that is stored at pages of the data unit, as explained in more details below.

In order to release parity data of the scanned pages of the data unit, selective sampling management component 113 can scan the set of pages of the data unit that have been programmed. If the scan results indicate that the scanned pages are not defective, selective sampling management component 113 can determine that the data stored at the scanned pages is valid and thus the pages are unlikely to need recovery using the parity data. Selective sampling management component 113 can thus release the parity data associated with the scanned pages. In certain implementations, if the scan operation is initiated in response to detecting an increased program time of a page of the data unit, selective sampling management component 113 can determine that pages within a blast radius of the page may still be at risk of having a defect introduced with further programming operations. Selective sampling management component 113 can thus retain parity data for the pages that are within the blast radius of the page.

In yet other implementations, when selective sampling management component 113 detects an increased program time of a page of the data unit, selective sampling management component 113 can assign the page to a list of scan candidate pages of the data unit and can defer scanning the data unit until all pages of the data unit have been programmed. When selective sampling management component 113 detects that all pages of the data unit have been programmed, selective sampling management component 113 can inspect the list of scan candidate pages of the data unit and if any page is assigned to the list, selective sampling management component 113 can initiate a scan operation of the data unit. On the other hand, if no pages are assigned to the list of scan candidates, selective sampling management component 113 can exclude the data unit from being scanned during the current program erase cycle.

Figure 2A:
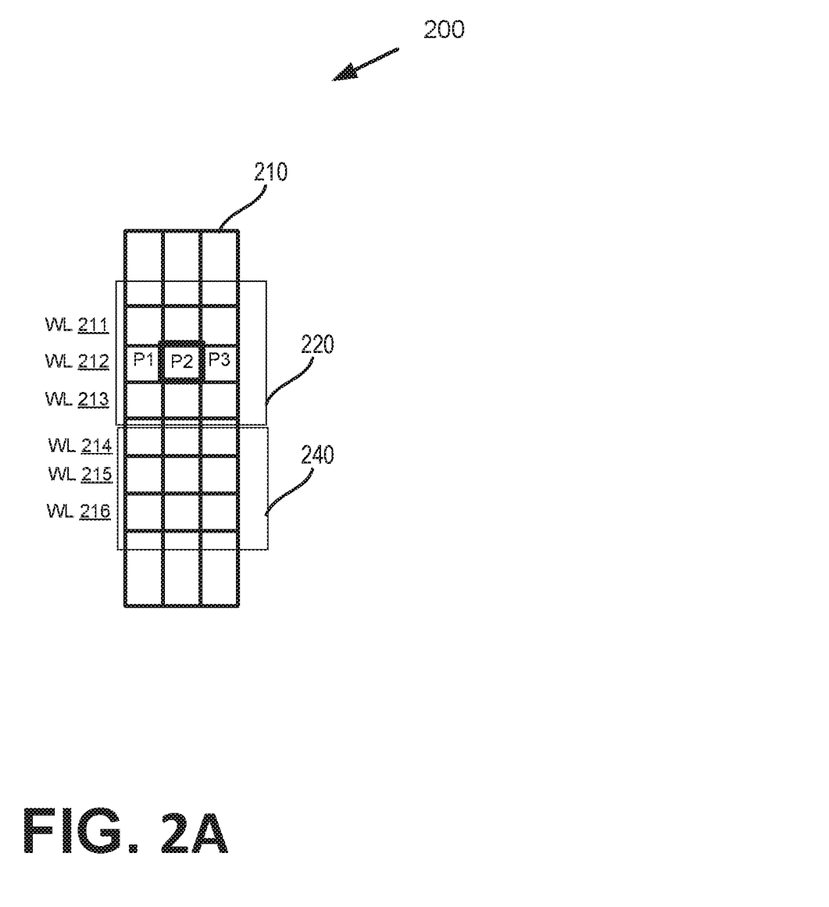
FIG. 2A illustrates an example of a process of scanning a set of pages of a data unit to release parity data for pages of the data unit that are free from defects, in accordance with some embodiments of the present disclosure

FIG. 2A illustrates an example 200 of a process of scanning a set of pages of a data unit to release parity data for pages of the data unit that are free from defects, in accordance with some embodiments of the present disclosure. In one implementation, data unit 210 can comprise a group of wordlines (WL) including WL211-216. A wordline can comprise a number of memory cells corresponding to one or more pages to store one or more bits of binary data corresponding to data received from the host system. In this case, each page P1-3 can include a separate group of memory cells of data unit 210. In one implementation, each WL of WLs 211-216 can include three pages. For example, WL 212 can include pages P1, P2, and P3.

In implementations, memory sub-system 110 performs a write operation to program data to page P2 and determines the program time of executing the write operation on page P2. Memory sub-system 110 can compare the program time with a reference program time that is determined to be indicative of healthy data units. If the program time associated with page P2 is longer than the reference program time by a predetermined margin (e.g., by 3 or more standard deviations), memory sub-system 110 can determine that data unit 210 is likely to have a defect, and can initiate a scan operation of a subset of pages of data unit 210 to release parity data associated with the pages if the scan operation does not indicate reliability issues with the scanned pages. Parity data can support a redundancy mechanism implemented by memory sub-system 110 to protect the host data against a failure of a portion of a memory device that is storing the host data. As an example, for a negative-and (NAND) type flash memory device, memory sub-system 110 can implement a redundant array of independent NAND (RAIN) operation to provide redundancy for the data stored on memory sub-system 110. For example, memory sub-system 110 can generate parity data when writing data received from the host system to memory sub-system 110. Memory sub-system 110 can generate the parity data based on an exclusive-or (XOR) operation with the received host data and use the parity data to reconstruct or recalculate the host data in the event of a failure of the portion of the memory device that is storing data from the host system. As an example, memory sub-system 110 can calculate parity data for a particular number of host data pages of a data unit of memory sub-system 110. The parity data can be generated based on an XOR operation among each of the host data stored on the particular number of pages. The parity data can then be stored at a data storage location dedicated for parity data. If a portion of a memory device storing one of the host data fails and the corresponding data is lost or corrupt, then memory sub-system 110 can reconstruct the lost/corrupt data based on an XOR operation among the rest of the host data and the parity data.

If memory sub-system 110 determines that the program time of page P2 is longer than the reference program time, memory sub-system 110 can initiate a scan operation of pages within WL211-216 that have been programmed. When the scan operation is complete with no identified defects, memory sub-system 110 can release parity data associated with the set of pages that are deemed safe from a defect. In this case, memory sub-system 110 can exclude the set of pages 220 that are within the blast radius from page P2. A blast radius of a memory device refers to a depth of radius around a page being programmed that determines the set of adjacent pages that can be impacted by programming the page, such that a defect can be introduced to any of the set pages within the blast radius as a result of programming the page in the center of the blast radius. For example, if the blast radius for memory sub-system 110 is 1, memory sub-system 110 can exclude from parity release pages that are in the same WL as page P2, pages that are within WL 211, and page that are within WL 213. Therefore, memory sub-system 110 can release parity for the set of pages 240 that have been programmed.

On the other hand, if the scan operation detects a defect in one or more of the scanned pages, memory sub-system can use the parity data corresponding to the pages to recover any data losses that the defect may have caused. Memory sub-system 110 can further move the data to another data unit and retire data unit 210 that contains the defect.

Figure 2B:
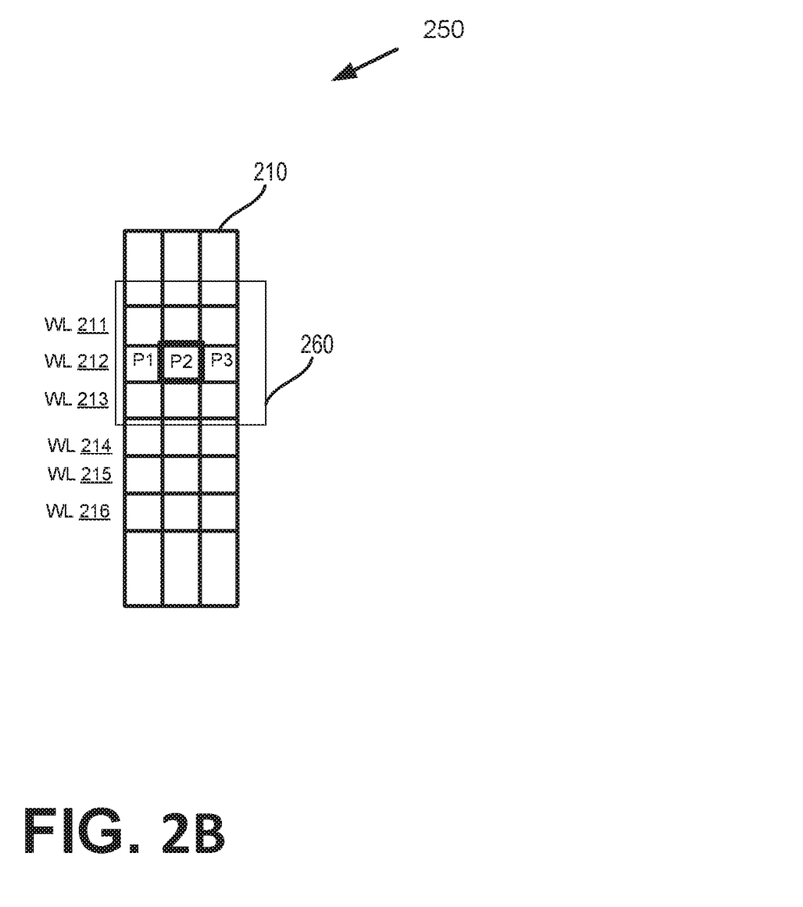
FIG. 2B illustrates another example of a process of scanning a set of pages of a data unit to determine whether or not to retire the data unit, in accordance with some embodiments of the present disclosure.

FIG. 2B illustrates another example 250 of a process of scanning a set of pages of a data unit to determine whether or not to retire the data unit, in accordance with some embodiments of the present disclosure. Similar to FIG. 2A, data unit 210 can comprise a group of wordlines including WL211-216, each WL of WLs 211-216 can include three pages. For example, WL 212 can include pages P1, P2, and P3.

In implementations, memory sub-system 110 performs a write operation to program data to page P2 of WL 212 and determines the program time of executing the write operation on page P2. Memory sub-system 110 can compare the program time with a reference program time that is determined to be indicative of healthy data units. If the program time associated with page P2 is longer than the reference program time by a predetermined margin (e.g., by 3 or more standard deviations), memory sub-system 110 can determine that data unit 210 is likely to have a defect, and can initiate a scan operation of a subset of pages of data unit 210 to determine whether or not the data unit can be retired. If memory sub-system 110 determines that the program time of page P2 is longer than the reference program time, memory sub-system 110 can initiate a scan operation of the set of pages 260, in order to determine whether or not to retire data unit 210. Set of pages 260 are the pages within the blast radius of P2. Memory sub-system 110 can limit the scanned pages to the set of pages 260 because the longer program time of P2 can be an indication of a defect that may impact any of the pages within the blast radius of P2.

When the set of pages 260 of data unit 210 are scanned (i.e., by performing read operations on the set of pages), memory sub-system 110 can determine a reliability metric based on the read operations, as an indicator of the health of the scanned pages. One example of a reliability metric is a raw bit error rate (RBER). The RBER can be defined as the ratio of the number of erroneous bits to the number of all data bits stored in a data unit of the memory sub-system 110. In one implementation, memory sub-system 110 can determine an average RBER corresponding to the scanned set of pages and can compare the average RBER to a predetermined range of acceptable RBER values. If the average RBER does not fall within the range of acceptable RBER values, memory sub-system 110 can determine that data unit 210 is defective and can retire data unit 210. Retiring the data unit refers to moving the data stored at data unit 210 to another data unit of memory sub-system 110, and marking data unit 210 such that it can no longer be used for storing host data.

On the other hand, if the average RBER falls within the range of acceptable RBER values, memory sub-system 110 can determine that data unit 210 is not defective and can continue to store host data at data unit 210.

Figure 3:
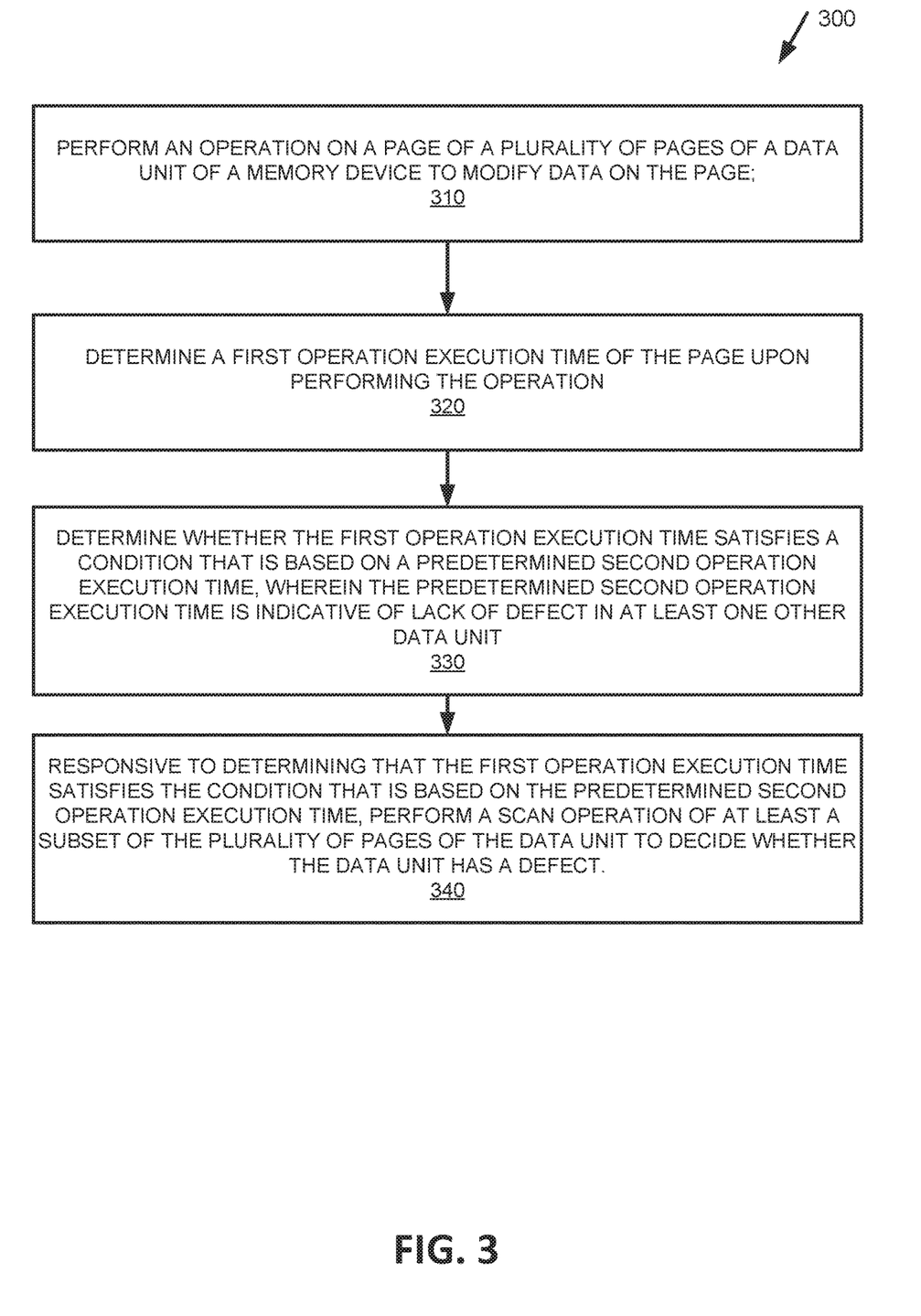
FIG. 3 is a flow diagram of an example method of supporting selective sampling of a data unit based on program/erase execution time in a memory sub-system, in accordance with some embodiments of the present disclosure

FIG. 3 is a flow diagram of an example method of supporting selective sampling of a data unit based on program/erase execution time in a memory sub-system, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by selective sampling management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, the processing logic performs an operation (e.g., an erase operation or a write operation) on a page of a plurality of pages of a data unit of a memory device to modify data on the page. In implementations, modifying data on the page can refer to erasing data of the page using an erase operation. In other implementations, modifying data on the page can refer to programming data on the page using a write operation, as explained in details herein.

At operation 320, the processing logic determines a first operation execution time of the page upon performing the operation (e.g., once the operation is completed). In an implementation, the processing logic can determine the program time of the page based on executing a write operation on the page to program data on the page (e.g., using a timer or timestamps of the start and end of the write operation). In another implementation, the processing logic can determine the erase time of the page based on executing an erase operation on the page to erase data stored on the page (e.g., using a timer or timestamps of the start and end of the erase operation), as explained in more details herein above.

At operation 330, the processing logic determines whether the first operation execution time satisfies a condition that is based on a predetermined second operation execution time (e.g., by determining whether the first operation execution time is within a predetermined margin from the predetermined second operation execution time). In implementations, the predetermined second operation execution time can refer to a reference program time or reference erase time that is determined to be indicative of lack of defect in at least one other data unit based on historical data, as explained in more details herein.

At operation 340, if the processing logic determines that the first operation execution time (e.g., program time of the page) satisfies a condition that is based on the predetermined second operation execution time (e.g., reference program time), the processing logic performs a scan operation of at least a subset of the pages of the data unit to decide whether or not the data unit has a defect. In implementations, the condition that is based on the predetermined second operation execution time can be determining whether or not the program time of the page is longer than the reference program time by a predetermined threshold, as explained in more details herein.

Figure 4:
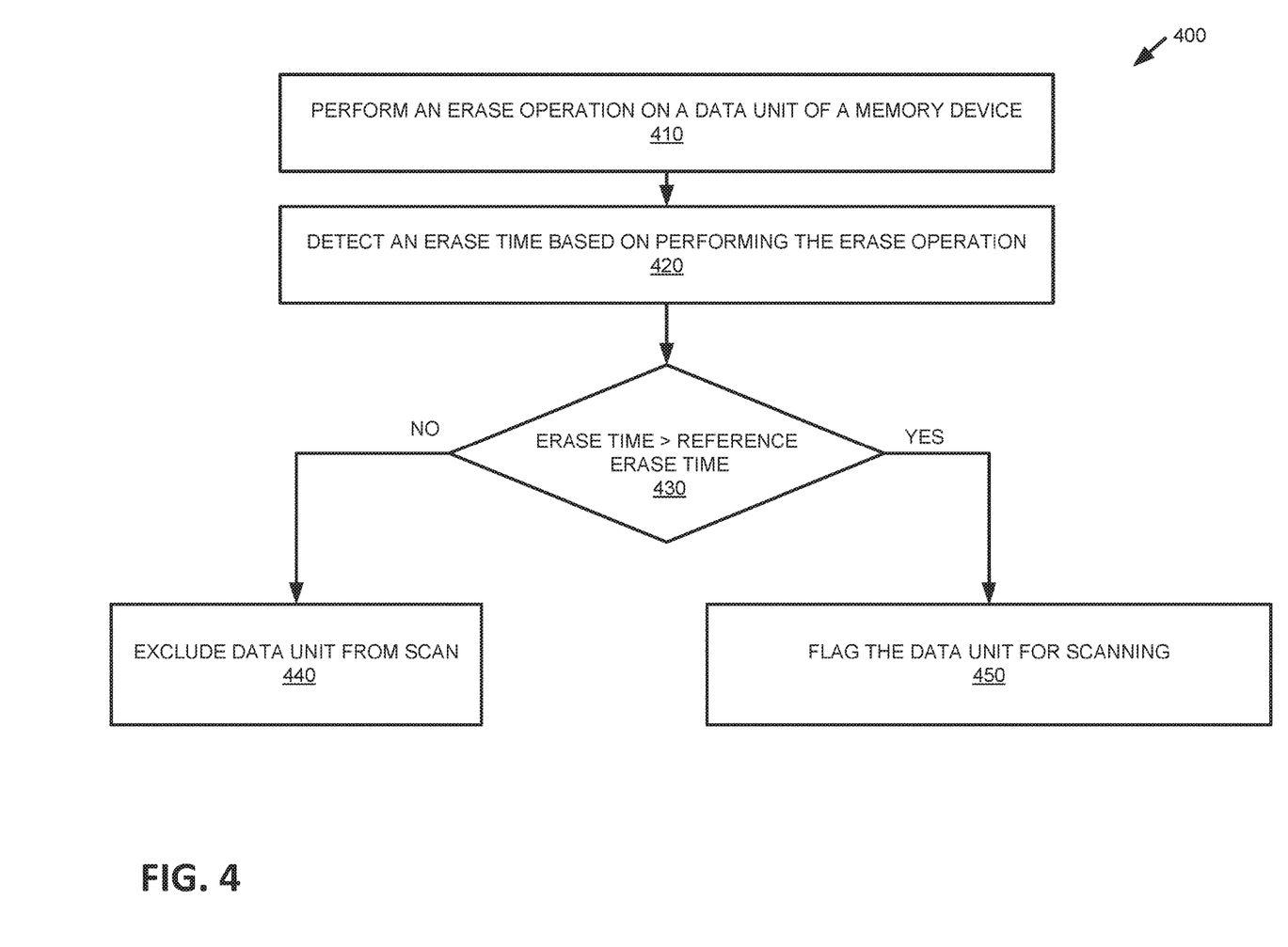
FIG. 4 is a flow diagram of an example method of supporting selective sampling of a data unit based on an erase operation execution time in a memory sub-system, in accordance with some embodiments of the present disclosure.

FIG. 4 is a flow diagram of an example method of supporting selective sampling of a data unit based on an erase operation execution time in a memory sub-system, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by selective sampling management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 410, the processing logic performs an erase operation on a data unit of a memory device to erase data stored on the data unit. At operation 420, the processing logic detects an erase time of the data unit. The erase time of the data unit refers to the period of time consumed in executing the erase operation on the data unit, as explained in more details herein.

At operation 430, the processing logic compares the erase time of the data unit with a predetermined reference erase time that corresponds to erase time of healthy data units. At operation 450, if the processing logic determines that the erase time of the data unit is longer than the reference erase time by a certain threshold (e.g., 3 or more standard deviations), the processing logic can flag the data unit for scanning. For example, since the data unit has been erased, the processing logic can flag the data unit to be scanned when a number of pages of the data unit have been programmed.

At operation 440, if the processing logic determines that the erase time of the data unit does not exceed the reference erase time (e.g., that the erase time of the data unit is within an acceptable variance from the reference erase time), the processing logic can determine that the data unit is unlikely to have a defect and can exclude the data unit from scanning in the current program/erase cycle. By excluding the data unit from scanning, the processing logic reduces the overhead of performing the scan operation on every data unit of the memory sub-system, thus improving the overall performance of the memory sub-system.

Figure 5:
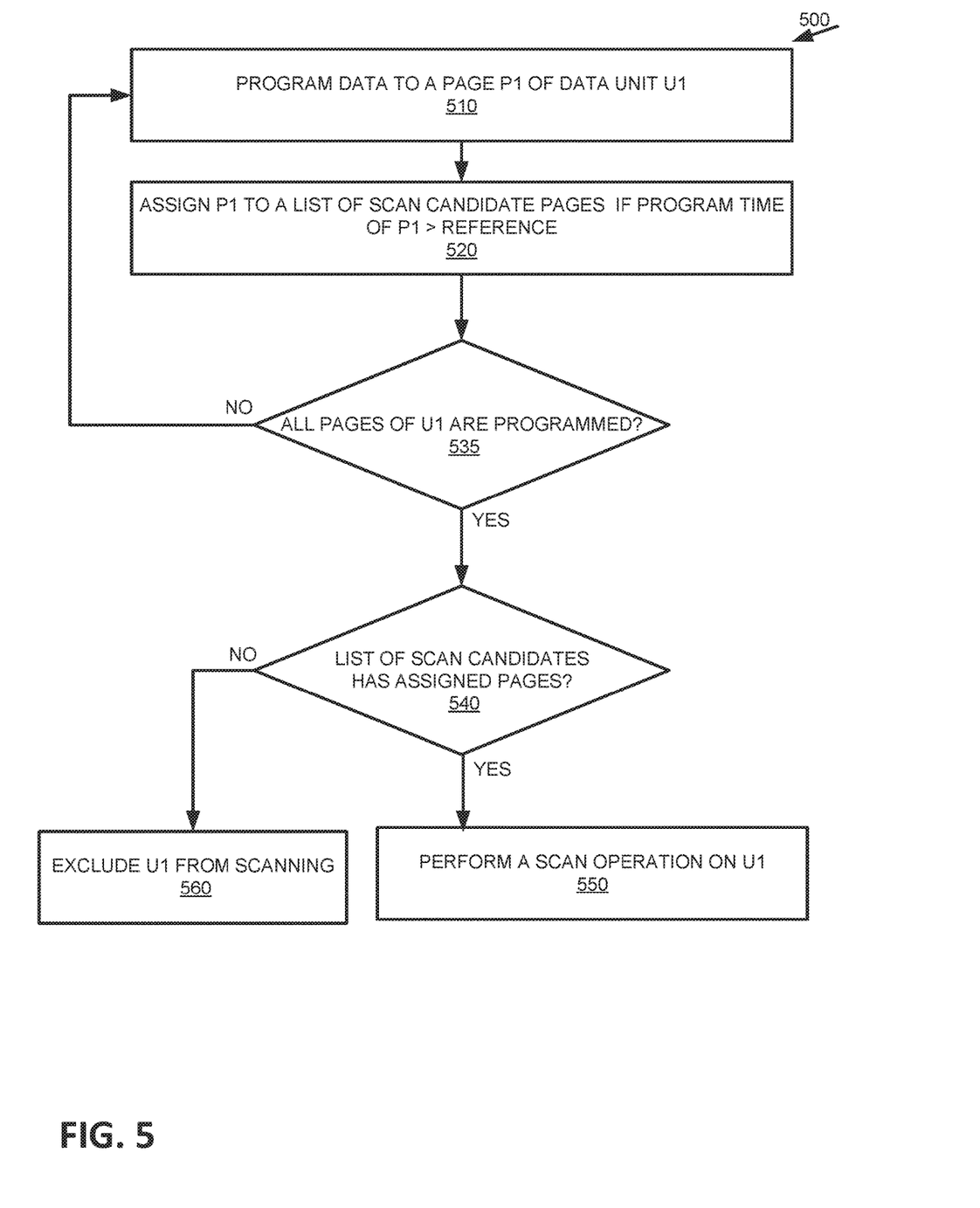
FIG. 5 is a flow diagram of another example method of supporting selective sampling of a data unit based on program time in a memory sub-system, in accordance with some embodiments of the present disclosure.

FIG. 5 is a flow diagram of another example method of supporting selective sampling of a data unit based on program time in a memory sub-system, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by selective sampling management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing logic performs a write operation to program data on a page P1 of a data unit U1, as explained in more details herein. At operation 520, the processing logic determines whether the program time of P1 is longer than a reference program time that is indicative of healthy data units, and assigns P1 to a list of scan candidate pages if the program time of P1 is indeed longer than the reference program time. In implementations, the processing logic assigns P1 to the list of scan candidate pages so that the memory sub-system can continue to program data on pages of data unit U1 without interrupting the programming process to perform a scan operation.

At operation 535, after programming P1, the processing logic determines whether or not all pages of data unit U1 have been programmed. If some pages of U1 are yet to be programmed, the processing logic may loop back to operation 510 to continue programming data on pages of data unit U1.

On the other hand, if the processing logic determines that all the pages of the data unit U1 have been programmed, the processing logic at operation 540 can inspect the list of scan candidate pages to find out if any page of the data unit U1 had a longer program time and thus a scan operation can be initiated. If the processing logic determines that one or more pages are assigned to the scan candidate pages, the processing logic at operation 550 can initiate a scan operation on the data unit U1 to determine if the data unit U1 have a defect, as explained in more details herein above. Conversely, if the processing logic determines that no pages are assigned to the scan candidate pages, the processing logic at operation 560 can determine that the data unit is unlikely to have a defect and can exclude the data unit U1 from scanning in the current program/erase cycle.

Figure 6:
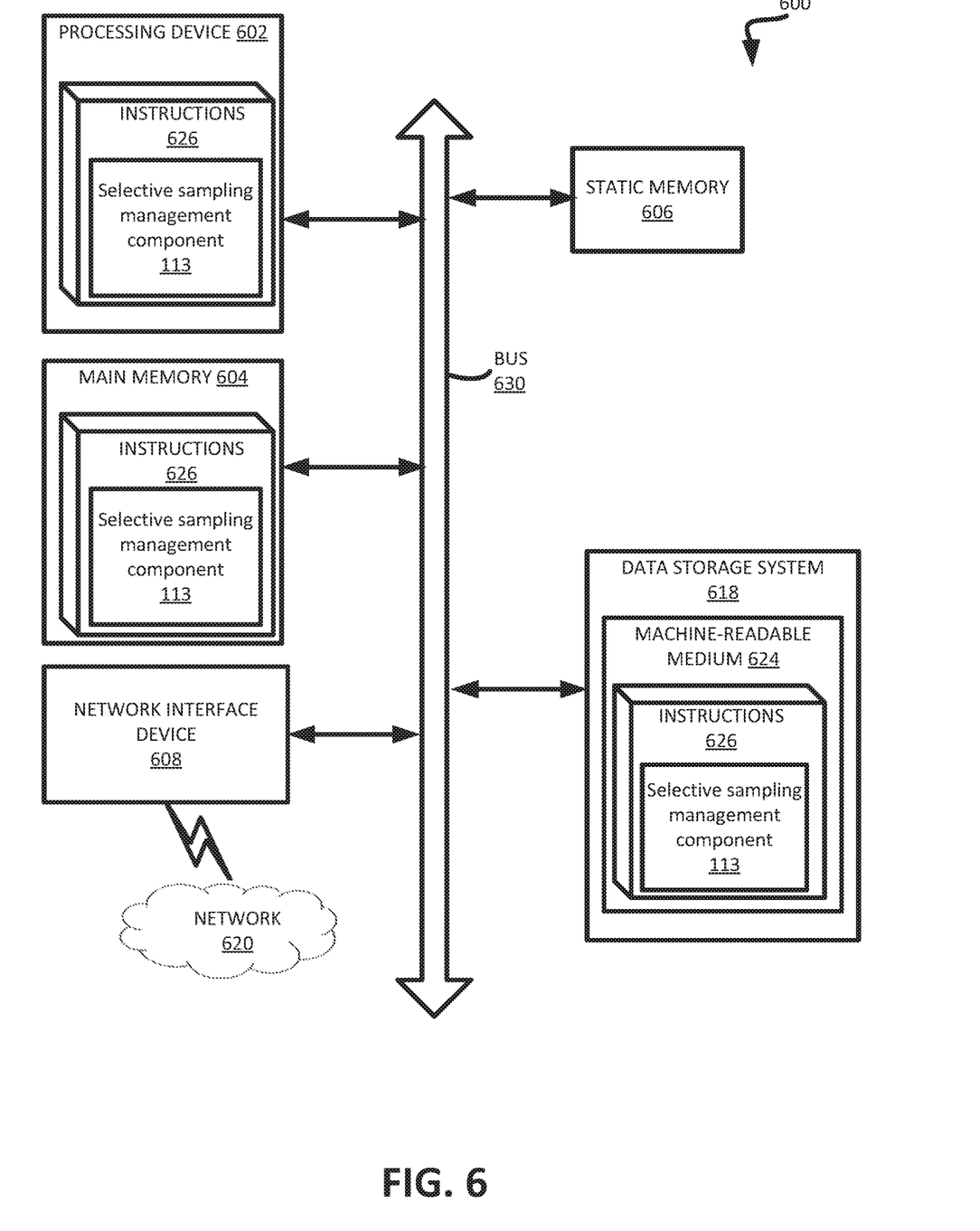
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to selective sampling management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to selective sampling management component 113 of FIG. 1. While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:
1. A method comprising:
performing an operation on a first page of a plurality of pages of a first data unit of a memory device to modify data on the first page;
determining a first operation execution time of the first page upon performing the operation on the first page;
determining whether the first operation execution time satisfies a condition that is based on a predetermined second operation execution time, wherein the predetermined second operation execution time is indicative of lack of defect in at least one other data unit; and responsive to determining that the first operation execution time satisfies the condition that is based on the predetermined second operation execution time, performing a scan operation of at least a subset of pages of the plurality of pages of the first data unit to decide whether the first data unit has a defect.

2. The method of claim 1, wherein the operation is an erase operation to erase data stored at the first data unit and the first operation execution time of the first page is an erase time of the first page.

3. The method of claim 2, wherein the predetermined second operation execution time is a reference erase time that is associated with the at least one other data unit identified as not having defects, and wherein the condition comprises determining that the erase time of the first page is within a predetermined variance from the reference erase time.

4. The method of claim 1, wherein the operation is a write operation to program data on the first page and the first operation execution time of the first page is a program time of the first page.

5. The method of claim 4, wherein the predetermined second operation execution time is a reference program time that is associated with the at least one other data unit identified as not having defects, and wherein the condition comprises determining that the program time of the first page is within a predetermined variance from the reference program time.

6. The system of claim 1, wherein the predetermined second operation execution time is derived from historical data associated with program times of a plurality of data units including the at least one other data unit identified as not having defects.

7. The method of claim 1, wherein performing the scan operation further comprises:
scanning the subset of pages;
determining that the subset of pages does not have a defect by identifying, from the scanning, that each page of the subset of pages is programmed outside of a blast radius of the first page; and
responsive to determining that the subset of pages does not have a defect, releasing parity data associated with the subset of pages.

8. The method of claim 1, wherein performing the scan operation further comprises:
scanning the subset of pages;
determining that the subset of pages has a defect by identifying, from the scanning, that the subset of pages comprises a second page programmed within a blast radius of the first page; and
responsive to determining that the subset of pages has a defect, retiring the first data unit.

9. The method of claim 8, wherein retiring the first data unit further comprises:
moving data stored at the first data unit to a second data unit; and
refraining from writing host data on the first data unit.

10. A system comprising:
a memory device; and
a processing device, operatively coupled with the memory device, to perform operations comprising:
performing a write operation on a first page of a plurality of pages of a first data unit of a memory device to program data on the first page;
determining a first program time of the first page upon performing the write operation on the first page;

determining whether the first program time satisfies a condition that is based on a predetermined second program time, wherein the predetermined second program time is indicative of lack of defect in at least one other data unit;
responsive to determining that the first program time satisfies the condition that is based on the predetermined second program time, assigning the first page to a list of scan candidate pages; and
upon detecting that programming of data on the plurality of pages of the first data unit has completed, performing, based on the list of scan candidate pages, a scan operation of at least a subset of the plurality of pages of the first data unit to decide whether the first data unit has a defect.

11. The system of claim 10, wherein performing the scan operation further comprises:
scanning a subset of pages of the plurality of pages of the first data unit;
determining that the subset of pages has a defect by identifying, from the scanning, that the subset of pages comprise a second page that is programmed within a blast radius from the first page; and
responsive to determining that the at least one page has a defect, retiring the first data unit.

12. The system of claim 11, wherein retiring the first data unit further comprises:
moving data stored at the first data unit to a second data unit; and
refraining from writing host data on the first data unit.

13. The system of claim 10, wherein performing the scan operation further comprises:
scanning a subset of pages of the plurality of pages of the first data unit;
determining that the subset of pages does not have a defect by identifying, from the scanning, that each page of the subset of pages is programmed outside of a blast radius of the first page; and
responsive to determining that the subset of pages does not have a defect, releasing parity data associated with the subset of pages.

14. The system of claim 13, wherein the parity data is stored at a separate location on the memory device, and wherein the parity data is based on host data stored at the first data unit.

15. The system of claim 10, wherein the predetermined second program time is a reference program time that is indicative of lack of defect in at least one other data unit, and wherein determining whether the first program time satisfies the condition comprises determining whether the first program time is within a predetermined variance from the predetermined second program time.

16. A non-transitory computer-readable storage medium comprising instructions that, when executed by a processing device, cause the processing device to:
perform an operation on a first page of a plurality of pages of a first data unit of a memory device to modify data on the first page;
determine a first operation execution time of the first page upon performing the operation on the first page;
determine whether the first operation execution time satisfies a condition that is based on a predetermined second operation execution time, wherein the predetermined second operation execution time is indicative of lack of defect in at least one other data unit; and
responsive to determining that the first operation execution time satisfies the condition that is based on the predetermined second operation execution time, perform a scan operation of at least a subset of pages of the plurality of pages of the first data unit to decide whether the first data unit has a defect.

17. The non-transitory computer-readable storage medium of claim 16, wherein the operation is an erase operation to erase data stored at the first data unit and the first operation execution time of the first page is an erase time of the first page, wherein the predetermined second operation execution time is a reference erase time that is associated with the at least one other data unit identified as not having defects, and wherein the condition comprises determining that the erase time of the first page is within a predetermined variance from the reference erase time.

18. The non-transitory computer-readable storage medium of claim 16, wherein the operation is a write operation to program data on the first page and the first operation execution time of the first page is a program time of the first page.

19. The non-transitory computer-readable storage medium of claim 18, wherein the predetermined second operation execution time is a reference program time that is associated with the at least one other data unit identified as not having defects, and wherein the condition comprises determining that the program time of the first page is within a predetermined variance from the reference program time.

20. The non-transitory computer-readable storage medium of claim 16, wherein, to perform the scan operation, the processing device is to:

scan the subset of pages;

determine whether the subset of pages does not have a defect by identifying, from the scanning, whether each page of the subset of pages is programmed outside of a blast radius of the first page;

responsive to determining that the subset of pages does not have a defect by identifying that each page of the subset of pages is programmed outside of the blast radius, release parity data associated with the subset of pages; and responsive to determining that the subset of pages has a defect by identifying that the subset of pages comprises a second page programmed within the blast radius, retire the first data unit.

\* \* \* \* \*